US 9,547,232 B2
Jan. 17, 2017

(12) United States Patent
Levinson et al.

(54) PELLICLE WITH AEROGEL SUPPORT FRAME

(71) Applicant: GLOBALFOUNDRIES Inc., Grand Cayman (KY)

(72) Inventors: Harry J. Levinson, Saratoga, CA (US); Obert R. Wood, II, Loudonville, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 139 days.

(21) Appl. No.: 14/560,688

(22) Filed: Dec. 4, 2014

(65) Prior Publication Data

US 2016/0161857 A1    Jun. 9, 2016

(51) Int. Cl.
| | | |
|---|---|---|
| *G03F 1/22* | (2012.01) | |
| *G03F 1/62* | (2012.01) | |
| *G03F 1/64* | (2012.01) | |
| *G03F 7/20* | (2006.01) | |

(52) U.S. Cl.
CPC . *G03F 1/64* (2013.01); *G03F 1/22* (2013.01); *G03F 1/62* (2013.01); *G03F 7/70916* (2013.01)

(58) Field of Classification Search
CPC ................. G03F 1/22; G03F 1/62; G03F 1/64
USPC ........................................... 430/5; 250/492.2
See application file for complete search history.

(10) Patent No.: US 9,547,232 B2
(45) Date of Patent: Jan. 17, 2017

(56) References Cited

U.S. PATENT DOCUMENTS

| | | | | |
|---|---|---|---|---|
| 7,723,704 B2 * | 5/2010 | Wood, II | ................ | B82Y 10/00 250/492.2 |
| 7,767,985 B2 * | 8/2010 | Okoroanyanwu | ..... | B82Y 10/00 250/492.2 |

OTHER PUBLICATIONS

Ko et al., "Effect of Extreme-ultraviolet Pellicle Support to Patterned Mask," Proc. of SPIE, vol. 8322 832230-1, 2012.
Shroff et al., "Progress in high transmission pellicles for EUVL," 2007 EUVL Symposium, Sapporo, Japan.
Shroff et al., "High transmission EUVL pellicle development," 2008 EUVL Symposium, Lake Tahoe.

* cited by examiner

*Primary Examiner* — Christopher Young
(74) *Attorney, Agent, or Firm* — Amerson Law Firm, PLLC

(57) ABSTRACT

Disclosed herein are various pellicles for use during extreme ultraviolet (EUV) photolithography processes. An EUV radiation device disclosed herein includes a reticle, a substrate support stage, a pellicle positioned between the reticle and the substrate support stage, wherein the pellicle includes an aerogel grid and a membrane formed on the aerogel grid, and a radiation source that is adapted to generate radiation at a wavelength of about 20 nm or less that is to be directed through the pellicle toward the reticle.

20 Claims, 3 Drawing Sheets

PELLICLE WITH AEROGEL SUPPORT FRAME

BACKGROUND OF THE INVENTION

1. Field of the Invention

Generally, the present disclosure relates to the manufacture of sophisticated semiconductor devices, and, more specifically, to a pellicle for use during extreme ultraviolet (EUV) photolithography processes with an aerogel support frame.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein field effect transistors (NMOS and PMOS transistors) represent one important type of circuit element used in manufacturing such integrated circuit devices. In general, integrated circuit devices are formed by performing a number of process operations in a detailed sequence or process flow. Such process operations typically include deposition, etching, ion implantation, photolithography and heating processes that are performed in a very detailed sequence to produce the final device.

Device designers are under constant pressure to increase the operating speed and electrical performance of transistors and integrated circuit products that employ such transistors. One technique that continues to be employed to achieve such results is the reduction in size of the various devices, such as the gate length of the transistors. The gate length (the distance between the source and drain regions) on modern transistor devices may be approximately 30-50 nm, and further downward scaling is anticipated in the future. Manufacturing devices that are so small is a very difficult challenge, particularly for some processes, such as photolithography tools and techniques.

Known photolithography tools include so-called steppers, in which each target portion is irradiated by exposing an entire pattern onto the target portion at one time, and so-called scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

Photolithography tools and systems typically include a source of radiation at a desired wavelength, an optical system and, typically, the use of a so-called mask or reticle that contains a pattern that is desired to be formed on a wafer. Radiation is provided through or reflected off the mask or reticle to form an image on a semiconductor wafer. The radiation used in such systems can be light, such as ultraviolet light, deep ultraviolet light (DUV), vacuum ultraviolet light (VUV), extreme ultraviolet light (EUV), etc. The radiation can also be x-ray radiation, e-beam radiation, etc. Generally, the image on the reticle is utilized to irradiate a light-sensitive layer of material, such as photoresist material. Ultimately, the irradiated layer of photoresist material is developed to define a patterned mask layer using known techniques. The patterned mask layer can be utilized to define doping regions, etched structures associated with an integrated circuit, etc. Currently, most of the photolithography systems employed are so-called deep ultraviolet systems (DUV) that generate radiation at a wavelength of 248 nm or 193 nm. However, the capabilities and limits of traditional DUV photolithography systems are being tested as device dimensions continue to shrink. This has led to the development of a so-called EUV system that uses radiation with a wavelength less than 20 nm, e.g., 13.5 nm.

Reducing particle contamination in photolithography processes, particularly on the reticle, has always been an ongoing issue that must be addressed. The presence of even very minute particles on the reticle or the associated equipment or wafer during the photolithography process may lead to the patterning of inaccurate or undesirable features on a wafer, and may lead to the formation of devices with reduced performance capabilities. In many cases, the presence of undesirable particles during photolithography processes may render the resulting devices inoperable. For that reason, semiconductor manufacturers go to great lengths and great expense to keep the photolithography processes they employ as clean as possible. This involves very detailed and expensive handling and cleaning procedures for all of the components of a photolithography system, including the reticles. The cleanliness requirement for photolithography processes is only going to increase as EUV systems are adopted because the EUV systems are sensitive to contamination by extremely small particles that might not create a problem for DUV systems. In addition, other non-particulate forms of contamination, e.g., organic and inorganic chemical contaminants, even at the level of a few atomic layers, must be prevented from adhering to critical surfaces.

Most modern photolithography tools include a pellicle that is positioned between the reticle and the wafer. Generally, conventional DUV photolithography systems which utilize wavelengths of 193 nm or more include the pellicle to seal off the mask or reticle to protect it from airborne particles and other forms of contamination. As mentioned above, contamination on the surface of the reticle or mask can cause manufacturing defects on the wafer. For example, pellicles are typically used to reduce the likelihood that particles might migrate into an exposure field of a reticle in a stepping lithographic system, i.e., into the object plane of the imaging system. If the reticle or mask is left unprotected, the contamination can require the mask or reticle to be cleaned or discarded. Cleaning the reticle or mask interrupts valuable manufacturing time and discarding the reticle or mask is costly. Replacing the reticle or mask also interrupts valuable manufacturing time.

A pellicle typically includes a pellicle frame and a membrane. The pellicle frame may include one or more walls which are securely attached to the absorber (chrome) side of the mask or reticle for an EUV application. Pellicles have also been employed with anti-reflective coatings on the membrane material. The membrane is stretched across the metal frame and is employed in an effort to prevent any contaminants from reaching the mask or reticle. The membrane is preferably thin enough to avoid the introduction of aberrations and to be optically transparent and yet strong enough to be stretched across the frame. The optical transmission losses associated with the membrane of the pellicle can affect the exposure time and throughput of the photolithography system. The optical transmission losses are due to reflection, absorption and scattering. Stretching the membrane ensures that it is substantially flat and does not adversely affect the image projected onto the wafer. The membrane of the pellicle generally covers the entire printable area of a mask or reticle and is sufficiently durable to withstand cleaning and handling.

Pellicles for EUV systems should be stable enough to retain their shape over long periods of time and many exposures to flashes of radiation and be tolerant of repeated maintenance procedures. Small particles that adhere to the pellicle surface (the membrane) generally do not significantly obstruct light directed to the surface of the wafer. The metal frame ensures that a minimum stand-off distance from the mask is provided to ensure that no more than about a 10% reduction in light intensity on the wafer surface is achieved for a particle of a particular size. The pellicle also tends to keep any optical signatures due to particles out of the depth of field of the lens. Thus, the stand-off distance of the pellicle is important in preventing contaminants from being imaged onto the wafer since the depth-of-field of the imaging lens is orders of magnitude smaller than the pellicle-mask stand-off distance.

Conventional materials used as a pellicle for EUV lithographic systems include thin metallic or ceramic films stretched and mounted over the reticle. Such films have usually consisted of membranes formed from silicon, silicon nitride, synthetic diamond, diamond-like carbon, etc. To avoid a huge loss of light throughput due to material absorption, these membranes typically have a maximum thickness in the range of about 50-100 nm. These membranes typically cover a relatively large area of about 100-200 $cm^2$. At such small thicknesses, these membranes are prone to destruction due to mechanical loading (from mounting and vibrations) and thermo-mechanical loading due to heat-induced stress. The heating effect is a direct result of the intrinsically high absorption of all substances in the EUV spectral region of interest (around 13.5 nm). Furthermore, the thermal loading at incident optical powers approaching several watts of in-band EUV power (likely needed for high volume manufacturing) can severely deform and even melt the membranes. Some attempts to counteract these mechanical shortcomings have been made by mounting the membranes on a rigid wire mesh. See, e.g., Schroff et. al., "High transmission pellicles for extreme ultraviolet lithography reticle protection," *J. Vac. Sci. Technol.*, B28, C6E36 (2010). However, such a solution has proven to be unworkable, probably due to the high light loss and light scattering as a result of the wire mesh backbone of the membrane. Such an approach has been largely abandoned.

There is a need for a pellicle to be used in EUV applications that is more durable or stable than conventional pellicle materials. The present invention is directed to several different embodiments of such a pellicle.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various pellicles for use during extreme ultraviolet (EUV) photolithography processes. In one example, an EUV radiation device disclosed herein includes a reticle, a substrate support stage, a pellicle positioned between the reticle and the substrate support stage, wherein the pellicle includes an aerogel grid and a membrane formed on the aerogel grid, and a radiation source that is adapted to generate radiation at a wavelength of about 20 nm or less that is to be directed through the pellicle toward the reticle.

In another illustrative example, a method disclosed herein includes positioning a pellicle between a reticle and a semiconducting substrate, wherein the pellicle includes an aerogel grid and a membrane formed on the aerogel grid, generating radiation at a wavelength of about 20 nm or less and directing the generated radiation through the pellicle toward the reticle such that a portion of the generated radiation reflects off of the reticle back through the pellicle toward the semiconducting substrate.

In still another illustrative example, a pellicle includes an aerogel grid and a membrane formed on the aerogel grid.

In yet another illustrative example, a method disclosed herein includes forming a release layer above a substrate, forming a membrane layer above the release layer, forming an aerogel layer defining a grid structure above the membrane layer, removing the release layer to separate the membrane layer and the aerogel layer from the substrate, and mounting the membrane layer and the aerogel layer to a frame.

BRIEF DESCRIPTION OF THE DRAWINGS

The disclosure may be understood by reference to the following description taken in conjunction with the accompanying drawings, in which like reference numerals identify like elements, and in which.

Figure 1A:
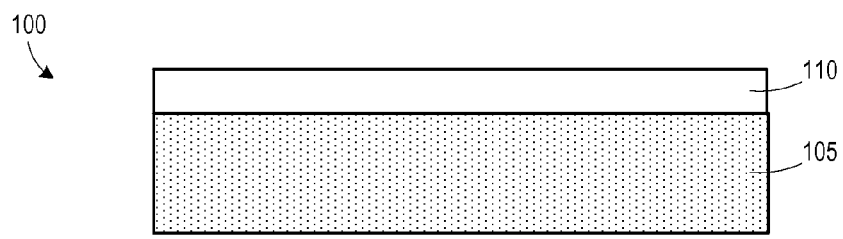
FIGS. 1A-1G are cross-sectional views of a device illustrating a method for forming a pellicle for EUV photolithography.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various pellicles for use during extreme ultra-violet (EUV) photolithography processes. As will be readily apparent to those skilled in the art upon a complete reading of the present application, the pellicles disclosed herein may be employed in the fabrication of a variety of devices, including, but not limited to, semiconductor devices, such as logic devices, memory devices, nano-optical devices, etc. With reference to the attached figures, various illustrative embodiments of the devices disclosed herein will now be described in more detail.

FIGS. 1A-1G are cross-sectional views of a device 100 illustrating various novel methods for forming a pellicle for EUV photolithography. The device 100 includes a substrate 105 with a release layer 110 (e.g., a polymer) formed thereon. The substrate 105 is a temporary member used in the fabrication of a pellicle, and thus it may have a variety of configurations, such as the bulk silicon configuration illustrated. Alternatively, the substrate 105 may have a silicon-on-insulator (SOI) configuration that includes a bulk silicon layer, a buried insulation layer and an active layer. The substrate 105 may be formed of silicon or silicon/germanium or it may be made of materials other than silicon, such as germanium. Thus, the terms "substrate" or "semiconductor substrate" should be understood to cover all semiconducting materials and all forms of such materials. The substrate 105 may have different layers other than those illustrated and may include epitaxially-deposited semiconductor layers. The release layer 110 allows the substrate 105 to be separate from the pellicle after its fabrication.

Figure 1B:
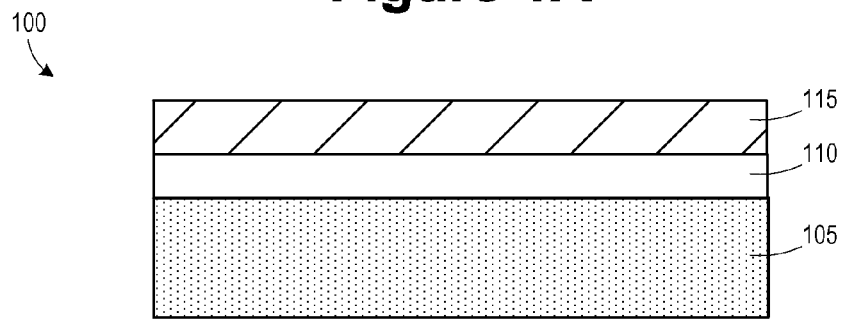

FIG. 1B illustrates the device 100 after a membrane layer 115 is formed above the release layer 110. In general, the membrane layer 115 is a low-absorption material with respect to the type of lithography process employed with the subsequently formed pellicle (e.g., EUV). Various materials may be used for the membrane layer 115, such as silicon (Si), silicon-carbon (SiC), beryllium (Be), boron-carbide ($B_4C$), lanthanum (La), silicon nitride ($Si_3N_4$), molybdenum (Mo), ruthenium (Ru), niobium (Nb), carbon nanotubes (CNT), synthetic diamond and diamond-like carbon, etc. In one illustrative embodiment, the low-absorption material may have a extinction coefficient in the EUV spectral region of about 6-20 nm that is less than about 0.02, and in other embodiments less than 0.002. Other materials that may be used in the membrane layer 115 in place of, or in combination with, the exemplary low absorption materials are single atomic-plane materials (e.g., graphene and h-BN). The thickness of the membrane layer 115 may vary depending upon the particular application and the material selected for the membrane layer 115, e.g., 0.5-50 nm.

Figure 1C:
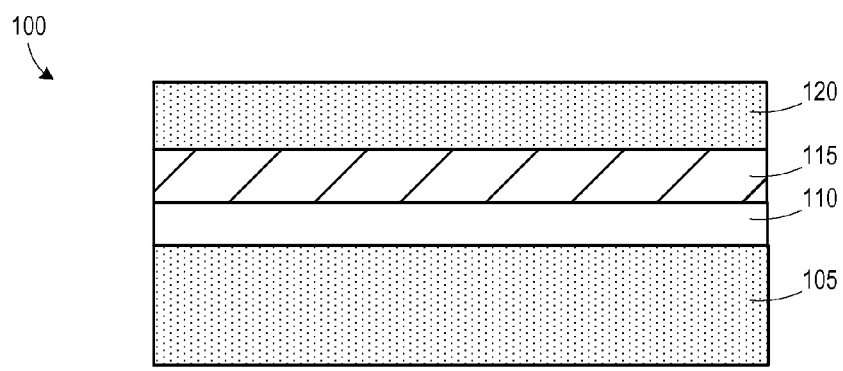

FIG. 1C illustrates the device 100 after an aerogel precursor layer 120 is formed above the membrane layer 115. The aerogel precursor layer 120 is a gel from which an aerogel material can be formed. For example, an exemplary aerogel precursor material is a silica alcogel (e.g., silica in an alcohol solution), but other types of aerogel precursor gels may be used, such as a silica hydrogel (i.e., water base). The aerogel precursor layer 120 may be formed by spin coating, Langmuir-Blodgett deposition, etc. The thickness of the aerogel precursor layer 120 may vary depending upon the particular application and the material selected for the aerogel precursor layer 120, e.g., 20-300 nm.

Figure 1D:
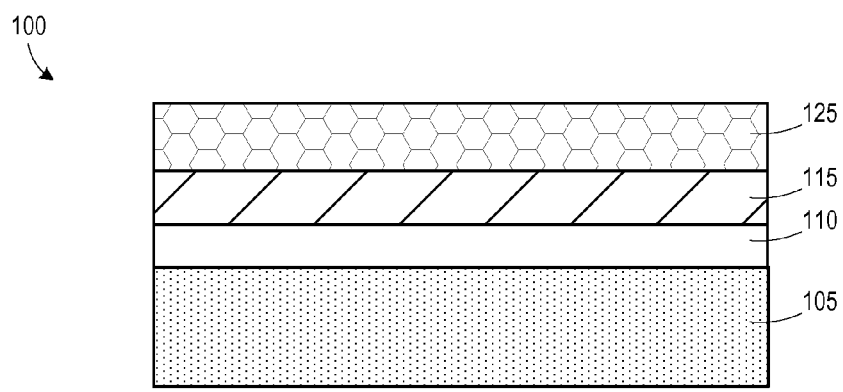

FIG. 1D illustrates the device 100 after the aerogel precursor layer 120 has been transformed to define an aerogel grid 125. In general, an aerogel is a synthetic porous ultralight material derived from a precursor gel, in which the liquid component (e.g., alcohol or water) of the precursor gel has been replaced with a gas. The manner in which an aerogel is formed from a precursor, such as the aerogel precursor layer 120, is well known to those skilled in the art. The patterned aerogel grid 125 exposes the underlying layer 115.

Figure 1E:
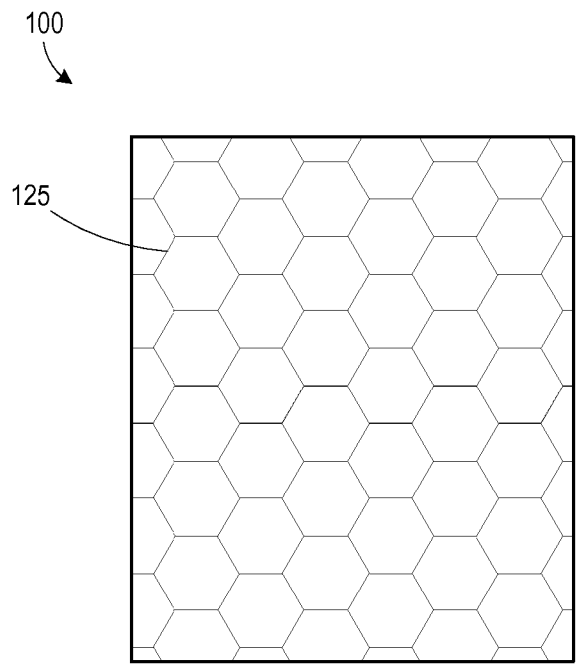

FIG. 1E illustrates a top view of the device 100 illustrating the aerogel grid 125. In one illustrated embodiment, the aerogel grid 125 defines a hexagonal pattern. The shading of the aerogel grid 125 in FIG. 1D is not intended to represent the actual cross-section of the layer, but rather to represent an illustrative top down shape of the aerogel grid 125 in one illustrative example. Although a hexagonal grid structure is illustrated, other types of grid shapes may be employed, such as a rectangular grid. In one embodiment, the aerogel precursor layer 120 is patterned by using a supercritical drying process to transform the aerogel precursor layer 120 to an aerogel layer and subsequently using a lithography process (e.g., mask and etch) to define the aerogel grid 125. In another embodiment, a modified sol-gel process may be used to define large open pores in the gel layer 120 during its conversion to an aerogel material to define the aerogel grid 125. In one example, the open pores may have a generally hexagonal shape.

Figure 1F:
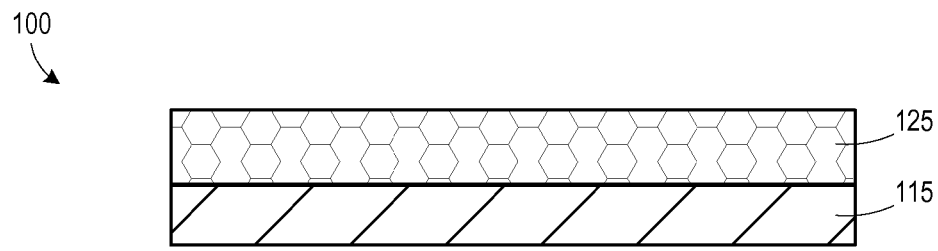

FIG. 1F illustrates the device 100 after the release layer 110 has been dissolved (e.g., using a solvent) to release the aerogel grid 125 and membrane layer 115 from the substrate 105.

Figure 1G:
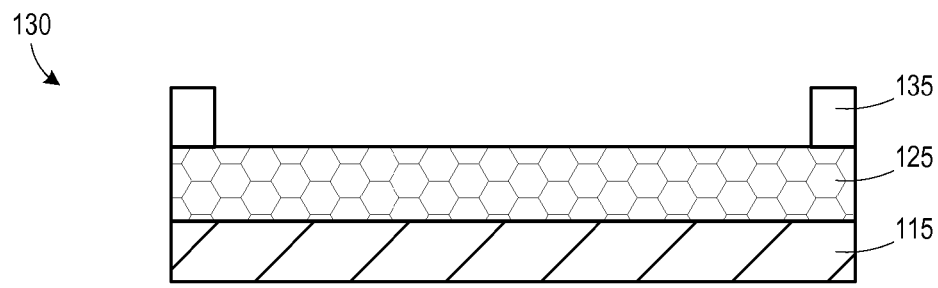

FIG. 1G illustrates a pellicle 130 formed by mounting the aerogel grid 125 and attached membrane layer 115 to a frame 135.

In some embodiments, the release layer 110 may not be used. The aerogel grid 125 may be formed on the substrate 105 and the substrate 105 may be polished from the back side and thinned to the desired final thickness to define the membrane layer 115.

The use of the aerogel grid 125 to support the membrane layer 115 results in a structure with relatively high rigidity with very low mass density. With low density, light absorption, and, therefore, image degradation introduced by the aerogel grid 125, can be minimized. As a result, use of the pellicle 130 in EUV systems results in significantly less degradation of image quality as compared to the use of grids made with conventional solids in EUV systems.

The physical size and shape of the pellicle 130 disclosed herein may vary depending upon the particular application and the photolithography system employed, e.g., the pellicle 130 may have a configuration that is circular, rectangular, square, etc. In one particularly illustrative example, the pellicle 130 disclosed herein may have a generally 6"×6" square configuration. The overall thickness of the pellicle 130 may vary depending upon the particular application. In one illustrative embodiment, the overall thickness of the pellicle 130 may fall within the range of about 0.3-50 nm, depending upon its composition and construction. The size of the openings defining the aerogel grid 125 may also vary depending on the particular application. In one illustrative embodiment, the openings may have a diameter of approximately 200-300 microns.

Figure 2A:
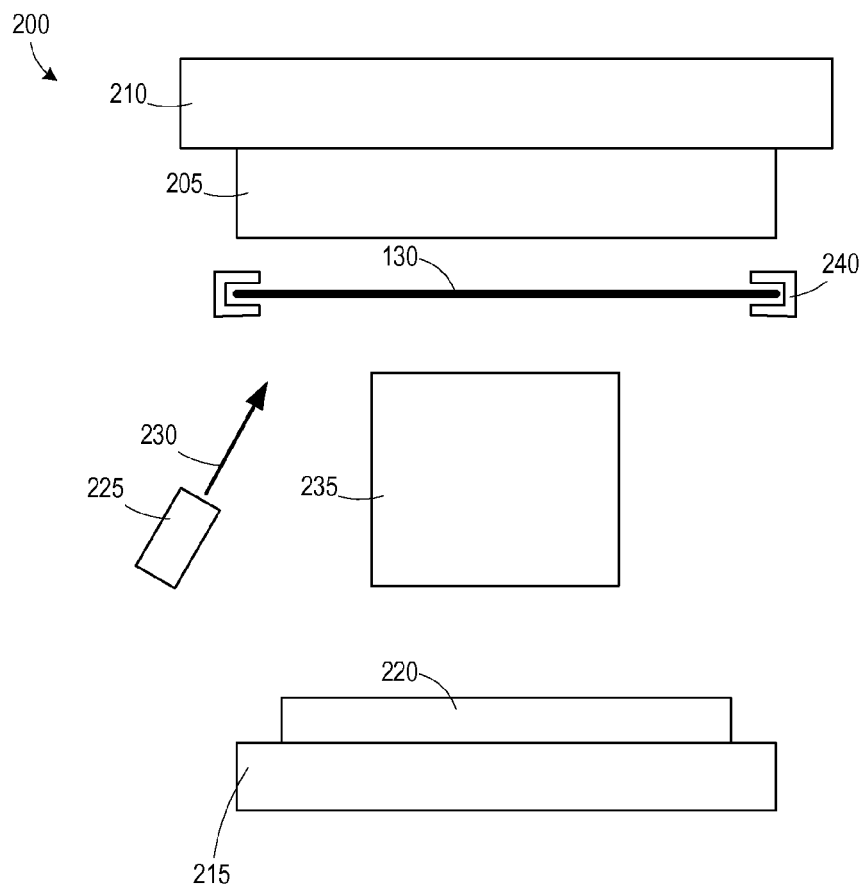
FIGS. 2A-2B are schematic depictions of an illustrative photolithography system wherein the pellicles disclosed herein may be employed.

Use of the pellicle 130 disclosed herein will be further described with reference to FIGS. 2A-2B. FIG. 2A is a schematic depiction of an illustrative photolithography system or tool 200 where the pellicle 130 may be employed, while FIG. 2B in an enlarged view of a portion of the photolithography system or tool 200. As shown in FIG. 2A, the photo-lithography system or tool 200 generally includes a photomask or reticle 205 supported by a reticle support stage 210, a wafer support stage 215 for supporting a wafer 220 (or substrate), a radiation source 225 for emitting EUV radiation 230, projection optics 235, and the pellicle 130. The pellicle 130 is secured within the photolithography system or tool 200 by illustrative and schematically depicted clamps 240, which may be of any of a variety of different mechanical structures and they are typically positioned on or adjacent the reticle frame. The radiation source 225 generates EUV radiation 230 that is directed through the pellicle 130 toward the reticle 205. The photolithography system or tool 200 may comprise multiple mirrors or lenses (not shown) for directing the EUV radiation 230 as desired. The illustrative wafer 220 includes multiple die (not shown) where integrated circuit devices are being formed. Of course, as will be appreciated by those skilled in the art, the schematic depiction of the photolithography system or tool 200 is simplistic in nature and it does not depict all aspects of a real-world EUV photolithography system or tool. Nevertheless, with benefit of the present disclosure, one skilled in the art will be able to employ the pellicles 130 disclosed herein on such EUV tools and systems.

Figure 2B:
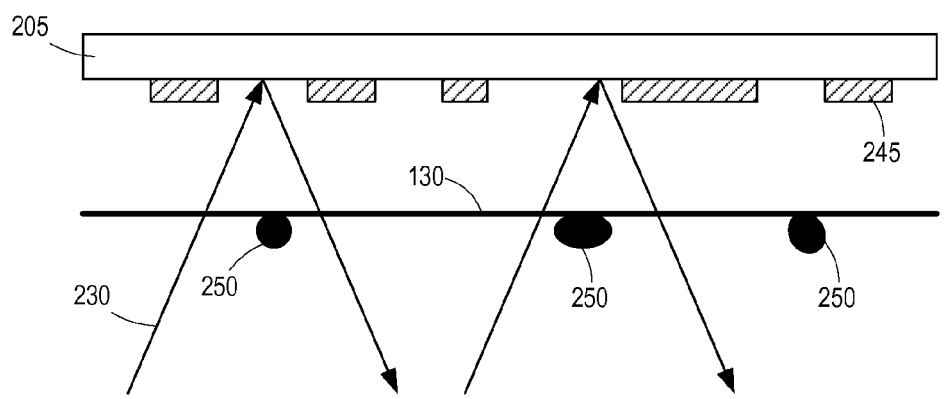

As depicted in FIG. 2B, the reticle 205 includes features 245 that are to be transferred to the underlying wafer 220 using EUV photolithography techniques. The reticle 205 is reflective and it includes a multi-layer thin film reflector that is tuned to reflect a significant portion of the EUV radiation, i.e., an amount of EUV radiation sufficient to perform the desired photolithographic processes. In one embodiment, the reticle 205 may include a multi-layer thin film reflector that is tuned to reflect EUV radiation of a given wavelength, e.g., 13.5 nm, the central wavelength of all the reflective surfaces of the optical system comprising the collector, illuminator and the projection optics. As noted above, a significant portion of the EUV radiation 230 is reflected off of the reticle 205 and, accordingly, passes through the pellicle 130 twice, as depicted in FIG. 2B. In general, the pellicle 130 is positioned between the reticle 205 and the wafer 220 in an effort to prevent particles 250 from landing on the reticle 205 during the photolithography process. The pellicle 130 is typically not positioned in the object plane of the photolithography system or tool 200 so that images corresponding to the particles 250 that land on the pellicle 130 are not in focus, i.e., not printed on the wafer 220. In one illustrative embodiment, the pellicle 130 may be placed a distance of about 2-10 mm below the reticle 205, although that distance may vary depending upon the particular application and the particular details of construction of the photolithography system or tool 200.

The pellicle 130 disclosed herein may be used to protect the reticle 205 in the photo-lithography system or tool 200 from particle contamination as described above. The pellicle 130 may be removed and cleaned or discarded in accordance with a desired maintenance plan, e.g., after a set number of wafers have been processed through the photolithography system or tool 200. The pellicle 130 disclosed herein is a robust and durable device that can be repeatedly cleaned and reused, thereby reducing the cost associated with EUV photolithography processing.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. An EUV radiation device, comprising:
   a reticle;
   a substrate support stage;
   a pellicle positioned between said reticle and said substrate support stage, wherein said pellicle comprises an aerogel grid and a membrane formed above said aerogel grid; and
   a radiation source that is adapted to generate radiation at a wavelength of about 20 nm or less that is to be directed through said pellicle toward said reticle.

2. The device of claim 1, wherein said membrane comprises a low-absorption layer of material having an extinction coefficient of at most about 0.02 in the EUV spectral region of about 6-20 nm.

3. The device of claim 1, wherein said membrane comprises silicon.

4. The device of claim 1, wherein said aerogel grid comprises silica aerogel.

5. The device of claim 1, wherein said aerogel grid comprises generally hexagonal openings.

6. A method, comprising:
   positioning a pellicle between a reticle and a semiconducting substrate, wherein said pellicle comprises an aerogel grid and a membrane formed on said aerogel grid;
   generating radiation at a wavelength of about 20 nm or less; and
   directing said generated radiation through said pellicle toward said reticle such that a portion of said generated radiation reflects off of said reticle back through said pellicle toward said semiconducting substrate.

7. The method of claim 6, further comprising, after irradiating said semiconducting substrate, removing said semiconducting substrate and positioning another semiconducting substrate under said pellicle and performing the steps recited in claim 6 on said another semiconducting substrate.

8. The method of claim 6, wherein said membrane comprises a low-absorption layer of material having an extinction coefficient of at most about 0.02 in the EUV spectral region of about 6-20 nm.

9. The method of claim 6, wherein said membrane comprises silicon.

10. The method of claim 6, wherein said aerogel grid comprises silica aerogel.

11. The method of claim 6, wherein said aerogel grid comprises generally hexagonal openings.

12. A pellicle, comprising:
    an aerogel grid; and
    a membrane formed on said aerogel grid.

13. The pellicle of claim 12, wherein said membrane comprises a low-absorption layer of material having an extinction coefficient of at most about 0.02 in the EUV spectral region of about 6-20 nm.

14. The pellicle of claim 12, wherein said membrane comprises silicon.

15. The pellicle of claim 12, wherein said aerogel grid comprises silica aerogel.

16. The pellicle of claim 12, wherein said aerogel grid comprises generally hexagonal openings.

17. A method, comprising:
    forming a release layer above a substrate;
    forming a membrane layer above said release layer;
    forming an aerogel layer defining a grid structure above said membrane layer;
    removing said release layer to separate said membrane layer and said aerogel layer from said substrate; and
    mounting said membrane layer and said aerogel layer to a frame.

18. The method of claim 17, wherein said forming said aerogel layer comprises:
    forming an aerogel precursor layer above said membrane;
    processing said aerogel precursor layer to form a aerogel layer; and
    patterning said aerogel layer using a lithography process to define said grid structure.

19. The method of claim 17, wherein said forming said aerogel layer comprises:
    forming an aerogel precursor layer above said membrane;
    processing said aerogel precursor layer to form said aerogel layer and to define open pores in said aerogel layer to define said grid structure.

20. The method of claim 17, wherein said aerogel layer comprises silica aerogel.

* * * * *